US008261688B2

(12) United States Patent
Antolotti et al.

(10) Patent No.: US 8,261,688 B2
(45) Date of Patent: Sep. 11, 2012

(54) TORCH FOR THERMAL SPRAYING OF SURFACE COATINGS, AND COATINGS OBTAINED THEREBY

(75) Inventors: Nelso Antolotti, Solignano (IT); Andrea Scrivani, Solignano (IT); Michele Scartazza, Solignano (IT); Gabriele Rizzi, Solignano (IT)

(73) Assignee: Turbocoating S.p.A., Collecchio (Parma) (IT)

( * ) Notice: Subject to any disclaimer, the term of this patent is extended or adjusted under 35 U.S.C. 154(b) by 946 days.

(21) Appl. No.: 12/297,181

(22) PCT Filed: Apr. 6, 2007

(86) PCT No.: PCT/EP2007/053426

§ 371 (c)(1),
(2), (4) Date: Oct. 14, 2008

(87) PCT Pub. No.: WO2007/116036

PCT Pub. Date: Oct. 18, 2007

(65) Prior Publication Data

US 2009/0217867 A1 Sep. 3, 2009

(30) Foreign Application Priority Data

Apr. 12, 2006 (IT) .............................. PR2006A0035

(51) Int. Cl.

| | |
|---|---|
| ***B05B 1/24*** | (2006.01) |
| ***B05B 7/16*** | (2006.01) |
| ***B05B 15/00*** | (2006.01) |
| ***B05B 3/06*** | (2006.01) |
| ***B05B 3/00*** | (2006.01) |
| ***B05B 7/00*** | (2006.01) |
| ***B05B 13/00*** | (2006.01) |
| ***B05B 13/02*** | (2006.01) |
| ***B05B 9/06*** | (2006.01) |
| ***B05C 5/04*** | (2006.01) |
| ***B05C 1/00*** | (2006.01) |
| ***B05C 21/00*** | (2006.01) |
| ***B05C 5/00*** | (2006.01) |
| ***B23K 9/00*** | (2006.01) |
| ***B23K 9/02*** | (2006.01) |
| ***F23D 11/44*** | (2006.01) |
| ***F23D 14/66*** | (2006.01) |
| ***C23C 16/00*** | (2006.01) |
| ***C23C 16/50*** | (2006.01) |

(52) U.S. Cl. ..... 118/323; 118/300; 118/500; 118/723 R; 118/723 HC; 118/723 DC; 118/724; 239/264; 239/255; 239/261; 239/132; 239/132.3; 219/121.44; 219/121.48; 219/121.49; 219/121.51

(58) Field of Classification Search .................. 239/255, 239/264, 261, 81, 128, 132, 132.3; 118/323, 118/300, 500, 723 R, 723 HC, 723 DC, 724; 219/121.44, 121.48, 121.49, 121.51
See application file for complete search history.

(56) References Cited

U.S. PATENT DOCUMENTS 3,004,588 A 10/1961 Christenson
(Continued)

FOREIGN PATENT DOCUMENTS

DE 10 2004 040162 3/2006
(Continued)

OTHER PUBLICATIONS

International Search Report dated Jul. 26, 2007, in PCT application.

*Primary Examiner* — Dah-Wei Yuan
*Assistant Examiner* — Binu Thomas
(74) *Attorney, Agent, or Firm* — Young & Thompson

(57) ABSTRACT

A torch (1) for thermal spraying of surface coatings, of the type that comprises a head (3) and a bracket (2) for the head (3), in which the head (3) pivots relative to the bracket (2). The invention also relates to the coatings obtained using the torch, whether of polymer, metal or ceramic materials, on any substrate coated thereby, whether of polymer, metal or ceramic or composite materials. The invention is applicable to different types of thermal spray torches, using plasma spray, combustion spray, High Velocity Oxygen Fuel (HVOF), or Low Velocity processes.

16 Claims, 5 Drawing Sheets

U.S. PATENT DOCUMENTS

| | | | | |
|---|---|---|---|---|
| 4,957,058 | A * | 9/1990 | Boguslavsky et al. | 118/323 |
| 7,578,451 | B2 * | 8/2009 | Mueller | 239/132.3 |
| 2008/0184932 | A1 | 8/2008 | Albrecht et al. | |
| 2008/0187676 | A1 * | 8/2008 | Blankenship | 427/446 |

FOREIGN PATENT DOCUMENTS

| | | |
|---|---|---|
| EP | 1 614 480 | 1/2006 |
| FR | 2 773 335 | 7/1999 |
| WO | WO 2004/037436 | 5/2004 |

* cited by examiner

PRIOR ART 1
2
3
4
6
6a
7
8
19
20
33
50

TORCH FOR THERMAL SPRAYING OF SURFACE COATINGS, AND COATINGS OBTAINED THEREBY

BACKGROUND OF THE INVENTION

1. Field of the Invention

The present invention relates to a torch for thermal spraying of surface coatings and to the coatings obtained by such torch.

2. Description of the Related Art

In recent times, the practice of applying coatings or surface treatments to mechanical parts has increasingly found application in the industry, in view of achieving functional properties that could not be obtained with the substrate and coating materials alone. A typical case relates to materials that have a high mechanical strength and exhibit a non-optimal behavior in wear or corrosion conditions. In this case, a surface treatment or a coating is applied to the surface of the part, to improve its wear or corrosion resistance.

Many deposition technologies are currently available, whose selection depends on the desired coating characteristics, and whose classification is based on a number of criteria, such as the thickness of the coatings to be obtained and the starting physical conditions of the materials used for the coating.

Among these technologies, thermal spraying has become increasingly appreciated due to the considerable variety of materials that can be used for coating and to the characteristics of the obtainable coatings.

The principle of thermal spray technologies consists in supplying energy to the material to be deposited until it melts, and transfer it to the substrate to be coated. Energy may be supplied to the material to be deposited from various sources: energy deriving from combustion between oxygen and a fuel, either in gas form (propane, acetylene, hydrogen) or in liquid form (kerosene) or deriving from recombination of ions in a plasma.

Thermal spray technologies include:

Combustion Flame Spray,

Arc Flame Spray,

Plasma Spray,

HVOF (High Velocity Oxygen Fuel).

The limitations of thermal spray processes are essentially due to their being line-of-sight processes.

This problem is solved by having the torch handled by a robot or a CNC, so that it can follow even complex outlines.

The coatable pieces may have any size, and the only limitation is the minimum size of cavities and holes: the torch must fit into the holes.

The main drawback of prior art is that it is not adequately applicable to coating of tubes having inner protrusions to be coated: in these instances, the torch has to be small enough to fit into the hole and as a rule, in modern practice, it is connected to a bracket which is in turn connected to the robot that allows it to be introduced in the cylinder to be coated.

The inner protrusions need to be coated all over their surfaces, and this cannot be fully achieved by the prior art torch connected to the bracket and the robot, which can only handle it along its motion axis, the torch being fixed with respect to the axis integral with the robot wrist.

SUMMARY OF THE INVENTION

The object of this invention is to provide a torch that obviates the above drawbacks, by allowing the torch to move relative to the axis of the robot wrist, and to follow any complex geometry of the object to be coated.

For example, the invention is particularly advantageous when coating cylinders whose inner surface has protruding surfaces; one application example relates to flame tubes for thermal barrier coatings.

Nevertheless, the above example does not intend to restrict the use of the torch to cylinder coatings.

Handling of the torch head provides a sufficient range of motion to obtain coatings of acceptable quality even on surfaces perpendicular to the bracket axis and generally to the axis of the cylinder to be coated.

Furthermore, as is known in the art, by inclining the spray direction, and therefore the direction of the torch head, relative to the surface to be coated, coating textures may be obtained, which improve the properties and characteristic of the coating.

These objects and advantages are achieved by the torch for thermal spraying of surface coatings of this invention, which is characterized as defined in the annexed claims.

BRIEF DESCRIPTION OF THE DRAWING FIGURES

These and other features will be more apparent from the following description of a few embodiments, which are shown by way of example and without limitation in the accompanying drawings, in which.

DETAILED DESCRIPTION OF THE INVENTION

Figure 1:
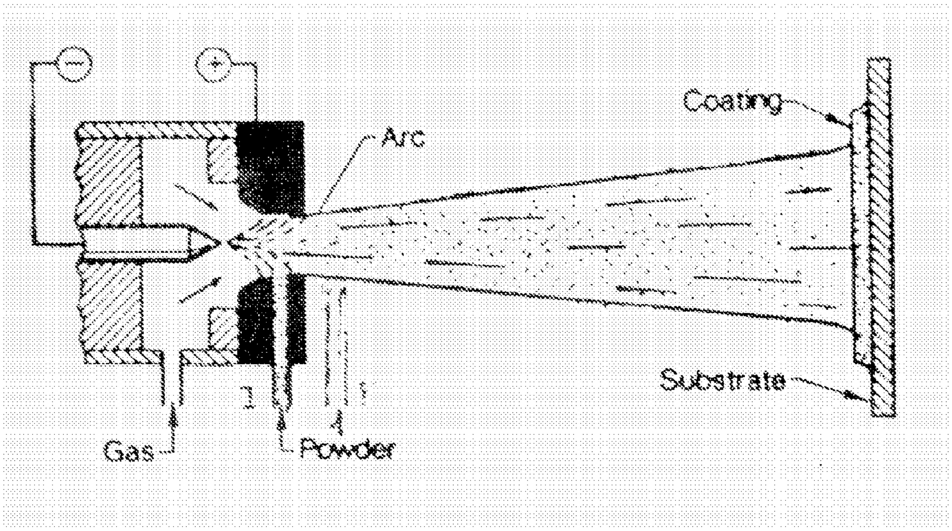
FIG. 1 shows a prior art coating torch.
Figures 2, 2A, 2B, 3:
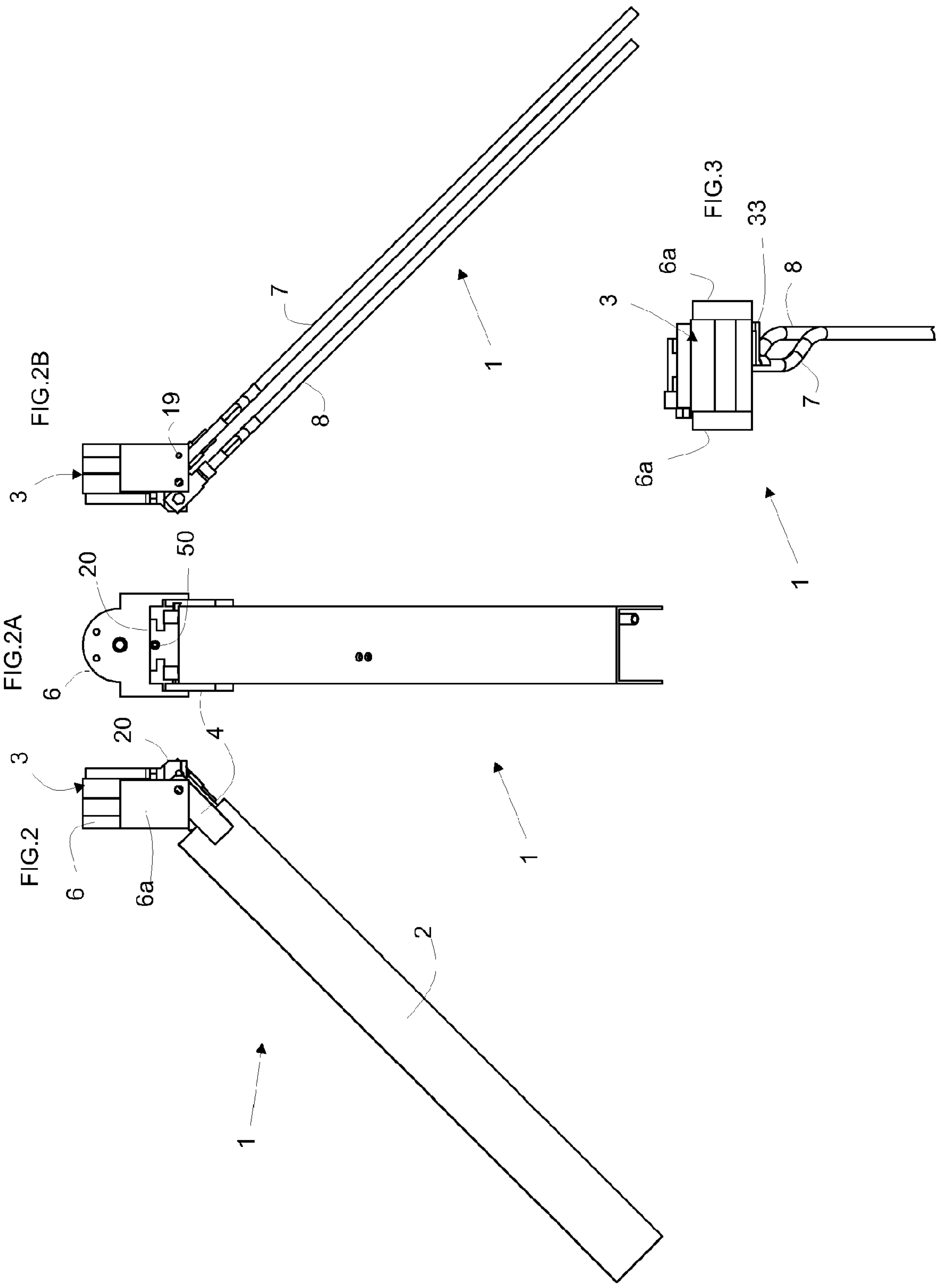
FIG. 2 is a side view of the coating torch of this invention.
FIG. 2A is a rear view of the torch of FIG. 2.
FIG. 2B is a subsequent side view without the delivery pipe covering bracket.
FIG. 3 is a top view of the torch of FIG. 2.

Referring to FIG. 1, a typical torch for plasma spraying of coatings is diagrammatically shown; this type of torch is generally operated by DC power.

In short, the cathode has a toroidal shape and is generally made of copper (Cu) possibly with a tungsten (W) insert, for improvement of its surface characteristics, and the cylindrical anode may be made of copper; both are internally water cooled.

An electric arc is struck between the cathode tip and the inside of the anode for plasma generation.

The plasma is continuously supported by new plasmagenic gas; once the steady state is reached, the plasma takes the form of a cylindrical flame coming out of the nozzle.

The temperature attained by the plasma is of the order of 9000 to 20000° K.

When plasma arrives near the nozzle, ions and electrons tend to recombine, thereby promoting a high level and enthalpy. Powder is radially introduced in this area, generally by means of a carrier gas; it melts due to the energy provided by recombination of positive ions and electrons, is conveyed by the flame and accelerated against the substrate, against which it impinges and is quickly solidified.

Several different energy values required to melt the particles may be obtained based on the above parameters.

As mentioned above, the limitations of such coating process lie in that it is an essentially line-of-sight process.

The invention relates to the use of the torch for spraying any coating, whether of polymer, metal or ceramic materials, on any substrate, whether of polymer, metal, ceramic or composite material.

The invention is applicable to different types of thermal spray torches, using plasma spray, combustion spray, High Velocity Oxygen Fuel (HVOF), or Low Velocity processes.

An embodiment of a plasma spray torch having particular functional characteristics is described herein. Nevertheless, the invention is applicable to any one of the above mentioned thermal spray technologies.

Referring to FIGS. 2, 2A, 2B, 3, 4, 5 and 6, numeral 1 generally designates a torch for thermal spraying of surface coatings.

Numeral 2 designates the bracket for connection to a guide arm, such as a robot arm (not shown), such bracket 2 also supporting the head 3 of the torch 1.

The head 3 and bracket 2 are joined together by two side plates 4, these plates 4 being welded to the bracket 2 and each having a hole for connection with the corresponding part of the head 3, so that the latter can pivot relative to the bracket 2.

More precisely, the plates 4 are connected by pins (not shown) with corresponding holes 5 of the head 3, which holes are formed on the two sides 6*a* of the support 6 of the head 3.

The head 3 has the typical substantially cylindrical shape of a normal plasma torch.

Powder will be introduced as shown in FIG. 1, i.e. according to prior art, radially and near the flame outlet.

Plasmagenic gas is introduced in the inlet channel 50 and conveyed to the head 3, wherefrom it is conveyed to the outlet as a flame, due to the electric arc struck between the cathode tip and the inside of the anode.

The figures show that the head 3 is connected, at the bottom, to a delivery unit 20 with housings formed therein for connection with the joints 11 of the delivery 7 and outlet 8 pipes of the cooling water circuit.

Conduits are provided on the delivery unit 20 for connection with the corresponding delivery and outlet pipes 7 and 8, which will be connected with corresponding conduits formed in the electrode head and in the nozzle head, which in turn have cavities for water circulation therein and cooling of the head 3.

Also, the delivery unit 20 also comprises the inlet pipe for the plasmagenic gas, to be later conveyed into the central hole and the nozzle head.

Each of the housings in contact with the joints of the delivery pipes contains a gasket for watertight connection with the corresponding joint; the gasket is made of an insulating material for sealing the head from the rest of the torch.

As the head 3 pivots, the housings rotate over the corresponding joints thereby driving them, the center of rotation of the head 3 (passing through the axis of the holes 5) not being coaxial with the axis of the joints.

Thus, the pipes 7 and 8 translate during rotation of the head 3 and namely translate with the support of two respective brackets 33, which are also used for carrying current to the anode and cathode of the head 3.

Figure 4:
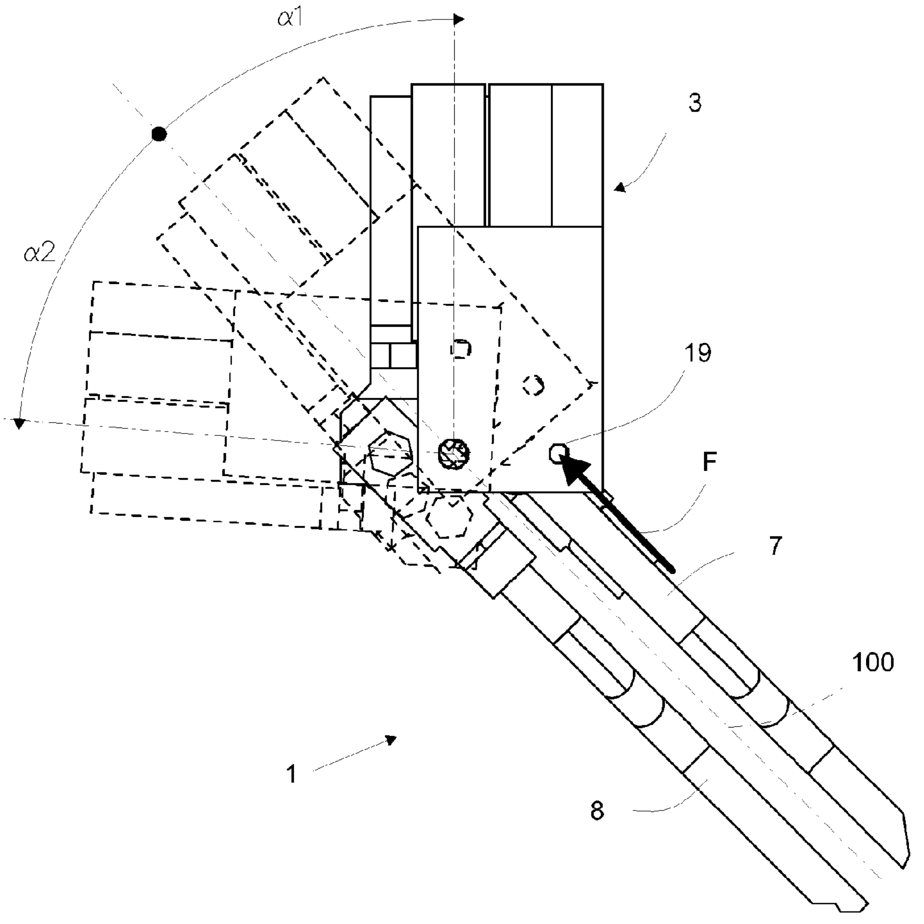
FIG. 4 shows a lateral detail of the head in two possible positions.
Figure 5:
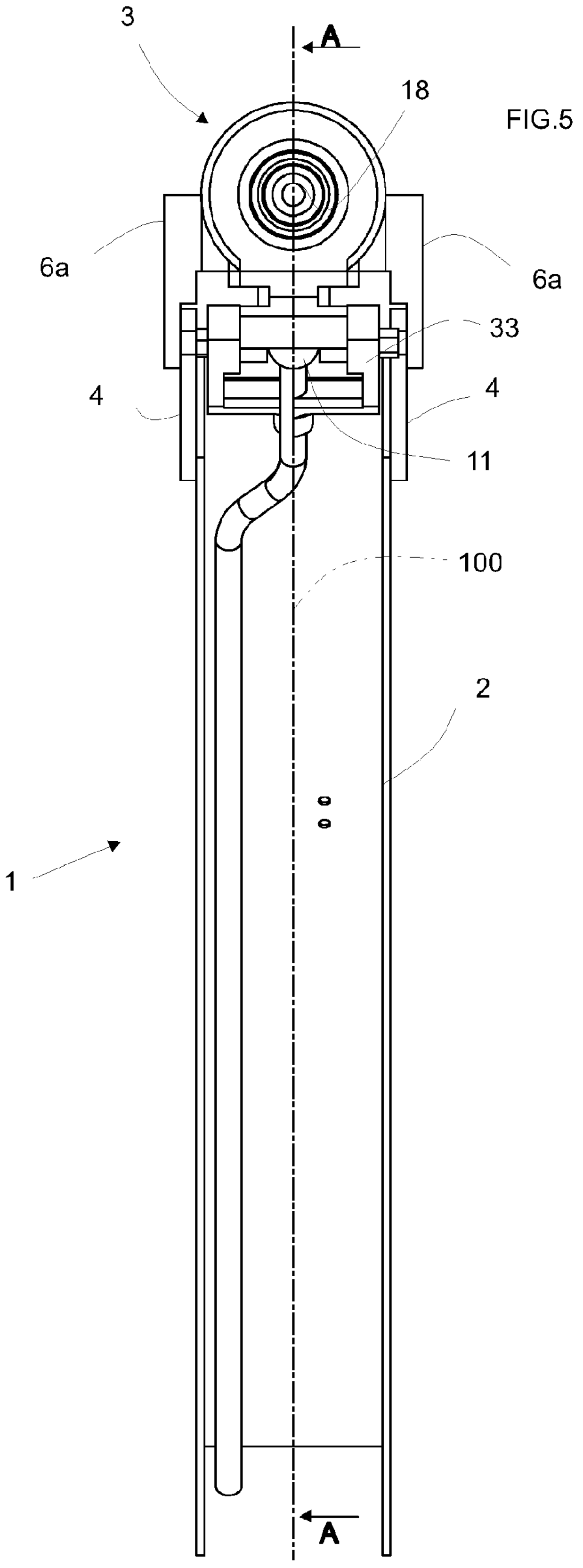
FIG. 5 shows a front view of the head of FIG. 2.
Figure 6:
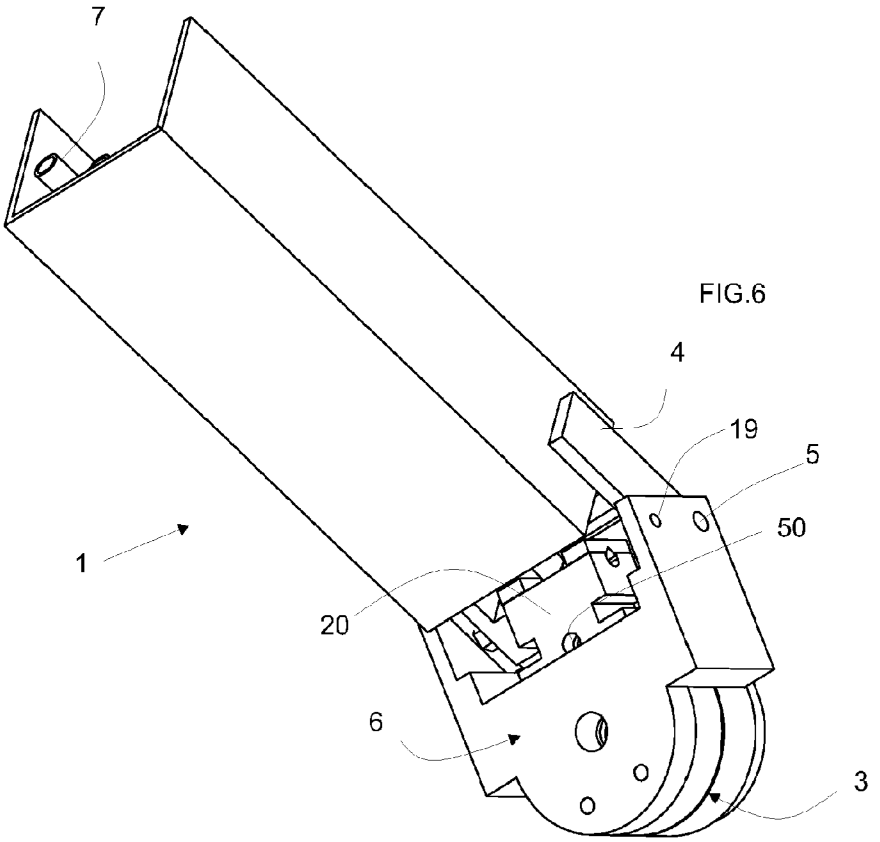
FIG. 6 is a rear perspective view of the torch of this invention.

The pivotal motion of the head 3 occurs by application of a force F at a hole 19 of the support 6, as shown in FIGS. 4 and 6.

The force F for causing pivotal motion of the head 3 may be exerted by a hydraulic or pneumatic or electric cylinder having a piston connected to the hole 5 of the support 6: the cylinder may be located on the bracket 2 alongside water pipes 7 and 8.

Without departure from the claimed scope, the means for applying the force F may be of any type, e.g. an electric motor.

The head 3 of the torch 1 may be moved relative to the axis of the bracket 2 connected to the robot arm, so that the head 3 is jointed and can rotate through a very wide angle of rotation with respect to such axis.

The angle of rotation of the head 3 is preferably in a range from +45° and −45° with respect to said axis of the bracket 2, as shown in FIG. 4, but suitable architectures, not shown, afford rotations of +135° and −135° (angles $\alpha$1 and $\alpha$2 in FIG. 4).

Such rotation may be a continuous or discrete motion.

The invention also relates to the coatings obtained using the torch, whether of polymer, metal or ceramic materials, on any substrate, whether of polymer, metal or ceramic or composite materials.

The invention claimed is:

1. A torch (1) configured for thermal spraying of surface coatings, comprising:

a head (3) in which an electric arc is struck between a cathode tip and an inside of an anode for plasma generation, the cathode tip and the anode both being internally water cooled, the head (3) comprising a delivery unit (20), and conduits are provided on said delivery unit (20) for connection with corresponding delivery and outlet pipes (7, 8), which are configured to be connected with cavities for water circulation of the head (3);

a bracket (2) for supporting the head (3), said head (3) pivots relative to the bracket (2), the bracket being connected to a guide arm; and two side plates (4) joining the head (4) and the bracket (2) together, the plates (4) being welded to the bracket (2) and each plate (4) having a hole for connection with a corresponding part of the head (3) so that the head (4) can pivot relative to the bracket (2), wherein said delivery unit (20) has housings formed therein for connection with joints (11) of the delivery (7) and outlet (8) pipes of the cooling water circuit and each of said housings comprises a gasket for watertight connection with the corresponding joint, and a center of rotation of the head (3) relative to the bracket (2) passes through an axis of the holes (5) not being coaxial with the an axis of the joints (11).

2. The torch (1) as claimed in claim 1, wherein said gaskets are made of an insulating material to seal the head (3) from the torch (1).

3. The torch (1) as claimed in claims 1, wherein as the head (3) pivots, the housings rotate over the corresponding joints (11), a center of rotation of the head (3) not being coaxial with the axis of the joints.

4. The torch (1) as claimed in claim 1, wherein the delivery and outlet pipes (7, 8) translate during rotation of the head (3) and are supported by respective brackets (33).

5. The torch (1) as claimed in claim 4, wherein said brackets (33) are also used to carry current to the anode and cathode of the head (3).

6. The torch (1) as claimed in claim 1, wherein the delivery unit (20) holds the conduits for connection with the respective delivery and outlet pipes (7, 8) and a plasmagenic gas inlet conduit (50).

7. The torch (1) as claimed in claim 1, wherein the pivotal motion of the head (3) is either a continuous or a discrete motion.

8. The torch (1) as claimed in claim 1, wherein it can spray any coating, whether of polymer, metal or ceramic materials, on any substrate, whether of polymer, metal, ceramic or composite material.

9. The torch (1) as claimed in claim 1, wherein the torch is applicable to different thermal spray torches, using plasma spray, combustion spray, High Velocity Oxygen Fuel (HVOF), or Low Velocity processes.

10. The torch (1) as claimed in claim 1, wherein the pivotal motion of the head (3) is controlled by means of a hydraulic or pneumatic cylinder.

11. The torch (1) as claimed in claim 10, wherein the pivotal motion of the head (3) is controlled by an electric motor.

12. A coating obtained using the torch as claimed in claim 1, said coating being of polymer, metal or ceramic materials, on any substrate, whether of polymer, metal, ceramic or composite material.

13. The torch (1) as claimed in claim 1, wherein said pivotal motion is in a range of angles from −135° to +135° with respect to an axis (100) of the bracket (2).

14. The torch (1) as claimed in claim 1, wherein said pivotal motion is in a range of angles from −45° to +45° with respect to an axis (100) of the bracket (2).

15. The torch (1) as claimed in claim 1, wherein the bracket (2) has two side plates (4) attached thereto, each having a hole for connection with corresponding holes (5) formed on two side flanks (6*a*) of a hinge support (6) on which the head (3) is attached.

16. The torch as claimed in claim 1, wherein a hydraulic or pneumatic or electric cylinder is configured for controlling the pivotal motion of the head (3), said pivotal motion of the head (3) occurs by application of a force (F) at a hole (19) of a support (6), the force (F) for causing pivotal motion of the head (3) may be exerted by the hydraulic or pneumatic or electric cylinder having a piston connected to the hole (5) of the support (6), and the cylinder is located on the bracket (2) alongside water pipes (7) and (8).

* * * * *